United States Patent
Kushiyama

(10) Patent No.: US 9,263,109 B2
(45) Date of Patent: Feb. 16, 2016

(54) OUTPUT DRIVER TO DRIVE SEMICONDUCTOR DEVICE AND MEMORY SYSTEM

(71) Applicant: KABUSHIKI KAISHA TOSHIBA, Minato-ku, Tokyo (JP)

(72) Inventor: Natsuki Kushiyama, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 184 days.

(21) Appl. No.: 13/835,923

(22) Filed: Mar. 15, 2013

(65) Prior Publication Data
US 2014/0071773 A1  Mar. 13, 2014

(30) Foreign Application Priority Data
Sep. 11, 2012  (JP) .................. 2012-199975

(51) Int. Cl.
*G11C 7/02*  (2006.01)
*G11C 7/12*  (2006.01)
*G11C 7/10*  (2006.01)
*G11C 29/02*  (2006.01)

(52) U.S. Cl.
CPC ............... *G11C 7/12* (2013.01); *G11C 7/1057* (2013.01); *G11C 7/1069* (2013.01); *G11C 29/022* (2013.01); *G11C 29/023* (2013.01); *G11C 29/028* (2013.01)

(58) Field of Classification Search
CPC ...... G11C 7/12; G11C 7/1057; G11C 29/022; G11C 29/023; G11C 29/028
USPC ......... 365/189.11, 189.05, 191, 198; 327/108
See application file for complete search history.

(56) References Cited

U.S. PATENT DOCUMENTS

| | | | |
|---|---|---|---|
| 6,690,605 B2 * | 2/2004 | Schafer | G11C 7/1051 365/189.05 |
| 7,664,999 B2 * | 2/2010 | Stave | 714/718 |
| 7,936,614 B2 * | 5/2011 | Kim | G11C 5/143 365/189.03 |
| 2010/0205343 A1 * | 8/2010 | Tell | 710/305 |

FOREIGN PATENT DOCUMENTS

| | | |
|---|---|---|
| JP | 11098001 A | 4/1999 |
| JP | 2002241184 A | 8/2002 |
| JP | 2003-218671 A | 7/2003 |

(Continued)

OTHER PUBLICATIONS

Jaeger et al., Microelectronic circuit design, 2ed, 2004, Fig. 7.19 and Fig. 7.23.*

(Continued)

*Primary Examiner* — Tan T Nguyen
(74) *Attorney, Agent, or Firm* — Holtz, Holtz & Volek PC

(57) ABSTRACT

According to one embodiment, an output driver which outputs an output signal to a transmission line, the output driver includes a pre-driver and a main driver. The pre-driver changes the duty ratio of a first drive signal and the duty ratio of a second drive signal to a plurality of patterns in accordance with a control signal. The main driver connects in series a first driver driven by the first drive signal and a second driver driven by the second drive signal. The main driver outputs the output signal to the transmission line from a connection node of the first and second drivers.

16 Claims, 9 Drawing Sheets

(56) References Cited

FOREIGN PATENT DOCUMENTS

| | | |
|---|---|---|
| JP | 2011-160213 A | 8/2011 |
| JP | 2011-228826 A | 11/2011 |

OTHER PUBLICATIONS

Japanese Office Action dated Dec. 16, 2014, issued in counterpart Japanese Application No. 2012-199975.

\* cited by examiner

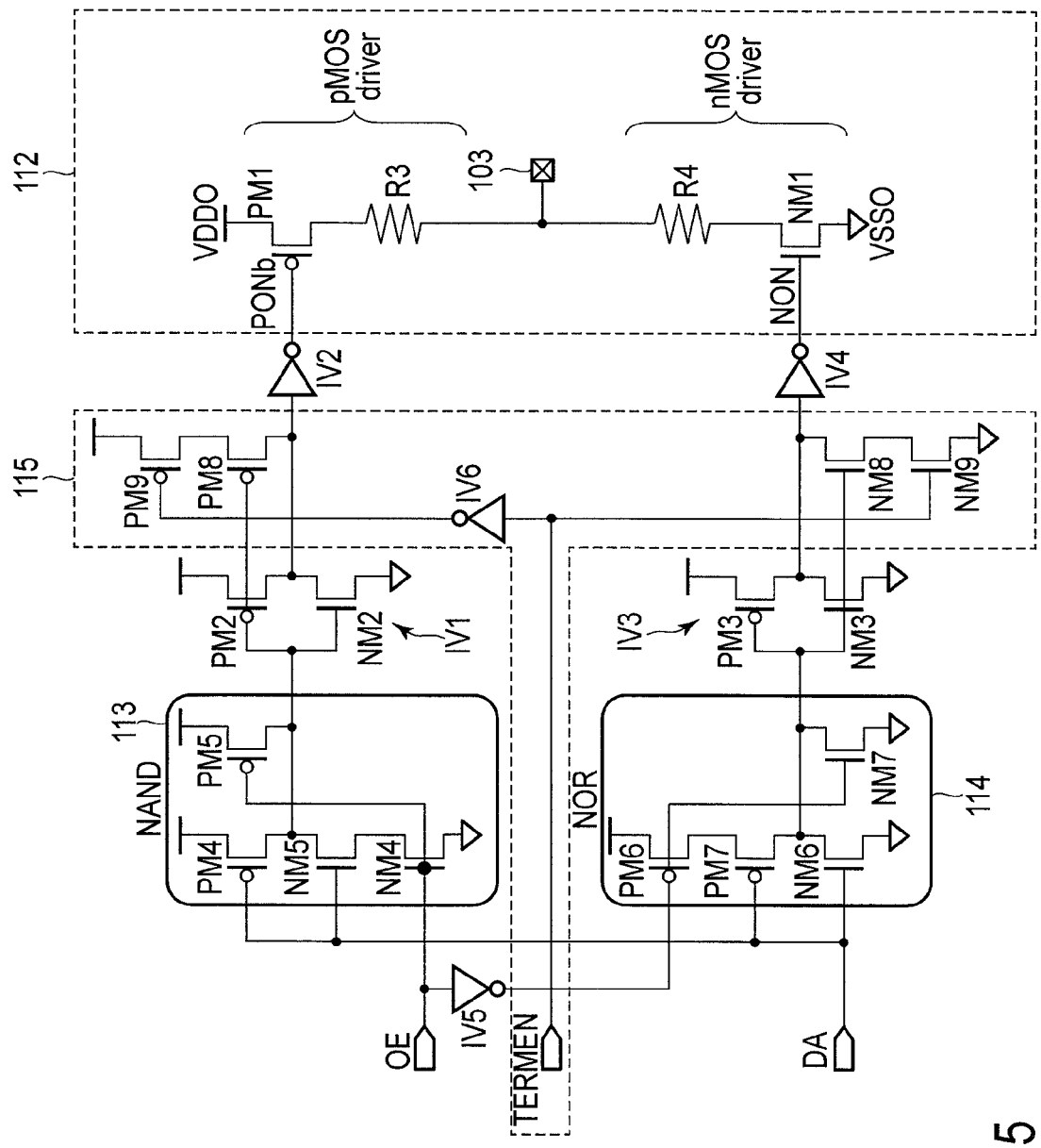
F I G. 5

OUTPUT DRIVER TO DRIVE SEMICONDUCTOR DEVICE AND MEMORY SYSTEM

CROSS-REFERENCE TO RELATED APPLICATIONS

This application is based upon and claims the benefit of priority from Japanese Patent Application No. 2012-199975, filed Sep. 11, 2012, the entire contents of which are incorporated herein by reference.

FIELD

Embodiments described herein relate generally to an output driver to drive a semiconductor device and memory system.

BACKGROUND

An output driver to drive a semiconductor device such as a semiconductor memory outputs an output signal to the semiconductor memory via a transmission line. In the semiconductor memory, a terminator is provided or not provided in the line for transmitting the output signal. Characteristics required for the output driver vary depending on the presence of the terminator. That the terminator is provided or present means that a resistance or the like is connected to a far end to prevent the output signal from being reflected by the terminator of the transmission line.

BRIEF DESCRIPTION OF THE DRAWINGS

FIG. 5 is a circuit diagram showing the configuration of the output driver according to the first embodiment;

DETAILED DESCRIPTION

Figure 1:
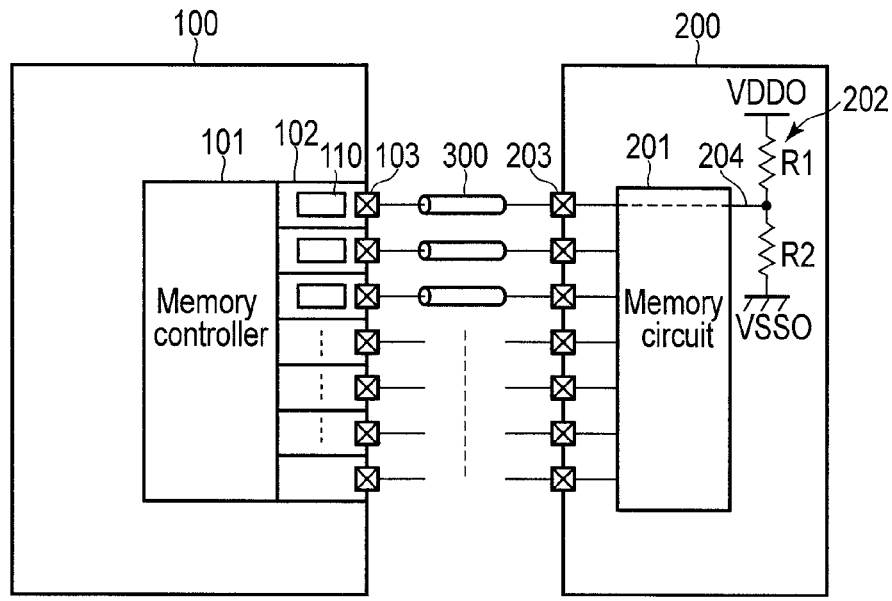
FIG. 1 is a block diagram showing the configuration of a memory system including an output driver according to a first embodiment.

In general, according to one embodiment, an output driver which outputs an output signal to a transmission line, the output driver includes a pre-driver and a main driver. The pre-driver changes the duty ratio of a first drive signal and the duty ratio of a second drive signal to a plurality of patterns in accordance with a control signal. The main driver connects in series a first driver driven by the first drive signal and a second driver driven by the second drive signal. The main driver outputs the output signal to the transmission line from a connection node of the first and second drivers.

The output driver according to the embodiment is described. Here, an output driver incorporated in a semiconductor integrated circuit to control a semiconductor memory is shown by way of example. The output driver has a p-channel MOS transistor and an re-channel MOS transistor as the main drivers for outputting signals.

Here, output from the output driver to a DRAM as the semiconductor memory is shown by way of example. There are various standards of the DRAM such as a DDR base including DDR2 and DDR3, and an LPDDR base including LPDDR1 and LPDDR2. In the DDR base, a terminator is generally disposed at the far end of a transmission line such as a DQ. However, in the LPDDR base, no terminator may be present at the far end for lower power consumption. Thus, the presence of the terminator is dependent on the type of semiconductor memory.

In an environment having the terminator, the signal driven by the output driver is absorbed by the terminator disposed in the semiconductor memory or disposed on a printed circuit board on which the semiconductor memory is mounted, so that the signal is not reflected and returned to the output driver. Therefore, if the terminator is present, the output driver has only to have desired output impedance when driving the signal. Accordingly, when the signal transitions from low to high and from high to low, the pMOS transistor and the nMOS transistor of the output driver are simultaneously turned off, that is, the output impedance is set to infinity to prevent the passage of a shoot-through current.

On the other hand, in an environment having no terminator, no terminator is present at the far end of the transmission line, that is, in the semiconductor memory or on the interconnect substrate. Therefore, the signal driven by the output driver is totally reflected by the end of the semiconductor memory, and returns to the output driver. If the pMOS transistor and the nMOS transistor of the output driver are simultaneously completely turned off at the moment of the transition of the signal output by the output driver from low to high and from high to low, the output impedance instantaneously reaches infinity, and the signal totally reflected and returned from the end of the semiconductor memory is again reflected by the output driver and returned to the semiconductor memory.

The re-reflected waves are superimposed on the signal transmitted to the semiconductor memory from the output driver, and is thus shaped into an irregular waveform. Therefore, in the environment having no terminator, the signal is shifted in the following way to prevent the pMOS transistor and the nMOS transistor of the output driver from being simultaneously completely turned off at the moment of the transition of the signal from low to high and from high to low: pMOS transistor turned on/nMOS transistor turned off→pMOS transistor weakly turned on/nMOS transistor weakly turned on→pMOS transistor turned off/nMOS transistor turned on. In this way, the increase of the output impedance during the shift of the signal is prevented.

The output driver according to the embodiment is described below with reference to the drawings. In the following description, components having the same functions and configurations are indicated by the same reference signs, and are repeatedly described only when necessary.

First Embodiment

An output driver according to the first embodiment is incorporated in a semiconductor integrated circuit such as an application-specific integrated circuit (ASIC), and drives a semiconductor device such as a semiconductor memory (for example, DRAM, NAND flash memory). A configuration which comprises the semiconductor integrated circuit including the output driver and the semiconductor memory driven by the output driver is hereinafter referred to as a memory system.

FIG. 1 is a block diagram showing the configuration of the memory system including the output driver according to the first embodiment.

As shown, the memory system comprises a semiconductor integrated circuit 100 and a semiconductor memory 200. The semiconductor integrated circuit 100 has a memory controller 101, an input/output circuit (I/O) 102, and an input/output terminal 103. The semiconductor memory 200 has a memory circuit 201, a terminator 202, and an input/output terminal 203. Moreover, a transmission line 300 is connected between the terminal 103 and the terminal 203.

The memory controller 101 controls the operation of the semiconductor memory 200. The input/output circuit 102 has an output driver 110 which outputs a data signal and a control signal to the semiconductor memory 200.

The memory circuit 201 includes a DDR-base DRAM or NAND flash memory. The terminator 202 comprises resistances R1 and R2 connected in series between a power supply voltage VDD0 and a reference voltage (for example, ground voltage) VSS0. An interconnect 204 connected to the terminal 203 is connected to a node between resistances R1 and R2 through the memory circuit 201.

A signal other than a power supply, such as the data signal and the control signal, is transmitted to the transmission line 300 from the terminal 103 of the semiconductor integrated circuit 100. The data signal includes, for example, data DQ, a data masking signal DM, and a data strobe signal DQS. The control signal includes, for example, a column address CA, a chip select CS, a clock CK, and a clock enable signal CKE. In the example described here, data DQ is transmitted.

The input/output circuit 102 has the output driver 110 as described above. The output driver 110 outputs data DQ to the semiconductor memory 200. More specifically, data DQ output from the terminal 103 of the output driver 110 is transmitted to the semiconductor memory 200 through the transmission line 300 and the terminal 203, and reaches the memory circuit 201. Data DQ which has passed through the memory circuit 201 then reaches the terminator 202, and is absorbed by the terminator 202. In the terminator 202, resistances R1 and R2 are adjusted to be the same as the resistances of the transmission line 300 and the interconnect 204. Thus, the terminator 202 absorbs data DQ.

Figure 2:
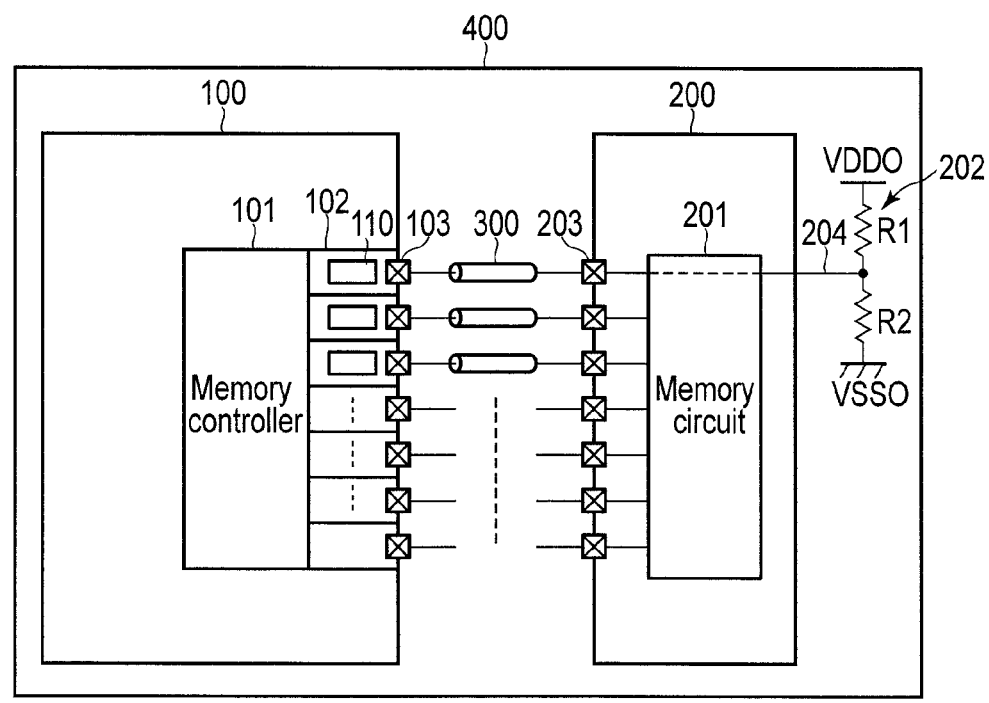
FIG. 2 is a block diagram showing a second configuration of the memory system including the output driver according to the first embodiment.

Although the terminator 202 is disposed in the semiconductor memory 200 in the example shown in FIG. 1, the terminator 202 may be disposed on a printed circuit board 400 outside the semiconductor memory 200 as shown in FIG. 2.

Figure 3:
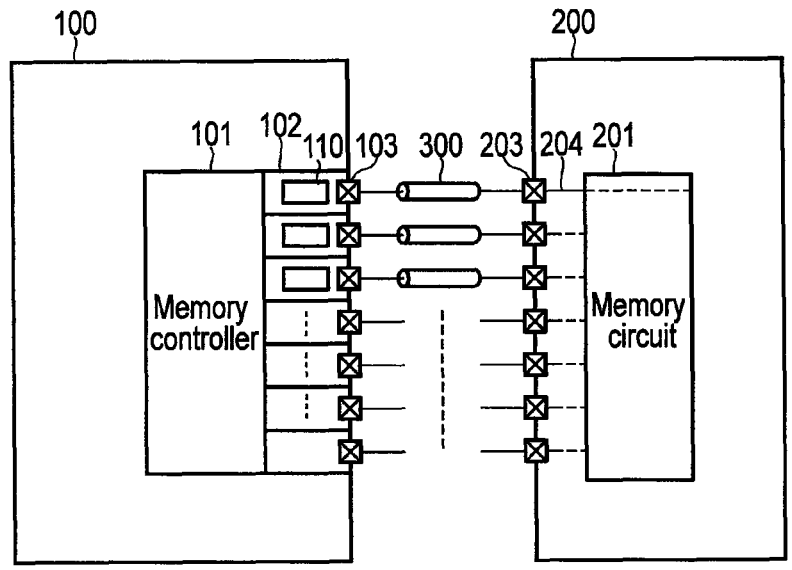
FIG. 3 is a block diagram showing a third configuration of the memory system including the output driver according to the first embodiment.

Furthermore, when no terminator is provided at the far end as shown in FIG. 3, the present embodiment can also be applied to, for example, an LPDDR-base DRAM. That is, the present embodiment can also be applied when no terminator is provided inside or outside the semiconductor memory 200.

When no terminator is provided, the data signal transmitted to the memory circuit 201 is reflected by the end of the interconnect 204, and returns into the semiconductor integrated circuit 100 through the transmission line 300. The data signal which has returned into the semiconductor integrated circuit 100 is absorbed by the output driver 110. This will be described later in detail.

Now, the output driver 110 provided in the input/output circuit 102 is described.

Figure 4:
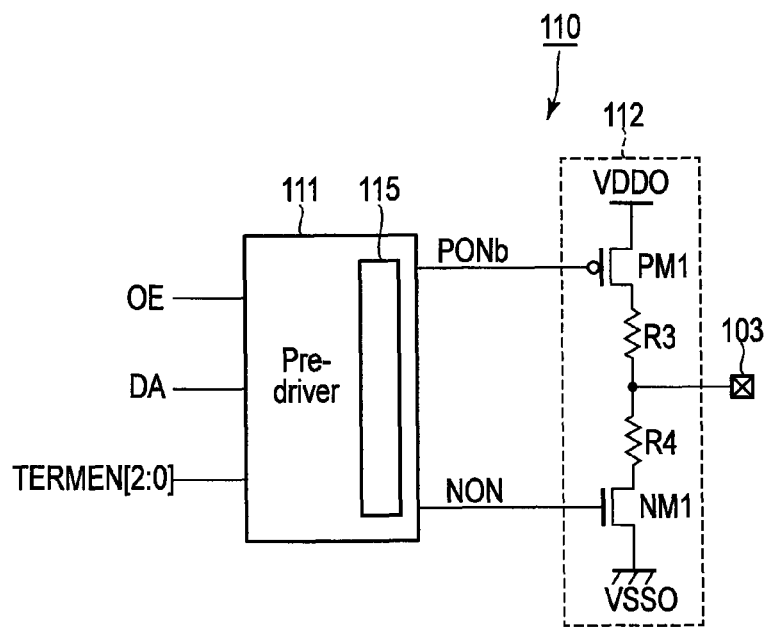
FIG. 4 is a diagram showing the configuration of the output driver according to the first embodiment.

FIG. 4 is a diagram showing the configuration of the output driver 110 in the input/output circuit 102.

As shown, the output driver 110 comprises a pre-driver 111 and a main driver 112.

The pre-driver 111 comprises a duty ratio adjustment circuit 115. A control signal TERMEN[2:0], data DA, and an output enable signal OE are input to the pre-driver 111. The pre-driver 111 generates drive signals PONb and NON in accordance with the control signal TERMEN[2:0], data DA, and the output enable signal OE. The drive signals PONb and NON are input to gates of pMOS transistor PM1 and nMOS transistor NM1 of the main driver 112, respectively. The control signal TERMEN[2:0] is a signal that indicates whether a terminator is provided at the ends of the transmission line 300 connected to the terminal 103 and the interconnect 204. The on/off timing of pMOS transistor PM1 and nMOS transistor NM1 can be changed by the control signal TERMEN[2:0]. That is, the control signal TERMEN[2:0] controls the duty ratios of the drive signals PONb and NON. The output enable signal OE is a signal that permits output, and may be omitted if output is only performed.

The main driver 112 has a pMOS driver comprising pMOS transistor PM1 and resistance R3, and an nMOS driver comprising nMOS transistor NM1 and resistance R4. The drain of pMOS transistor PM1 is connected to the drain of nMOS transistor NM1 via resistances R3 and R4. The source of pMOS transistor PM1 is connected to the power supply voltage VDD0, and the source of nMOS transistor NM1 is connected to the reference voltage VSS0.

Furthermore, the input/output terminal 103 is provided to a connection node between resistances R3 and R4. The main driver 112 is driven by signals PONb and NON, and outputs data DQ from the terminal 103.

FIG. 5 shows a detailed circuit diagram of the output driver according to the first embodiment.

The pre-driver 111 has a NAND gate 113, a NOR gate 114, a duty ratio adjustment circuit 115, and inverters IV1 (pMOS transistor PM2 and nMOS transistor NM2), IV2, IV3 (pMOS transistor PM3 and nMOS transistor NM3), IV4, and IV5. The NAND gate 113 includes pMOS transistors PM4 and PM5, and nMOS transistors NM4 and NM5. The NOR gate 114 includes pMOS transistors PM6 and PM7, and nMOS transistors NM6 and NM7. The duty ratio adjustment circuit 115 has pMOS transistors PM8 and PM9, nMOS transistors NM8 and NM9, and inverter IV6.

The NAND gate 113 outputs signal PONb to the main driver 112. Inverter IV1, one end of pMOS transistors PM8 and PM9 connected in series, and inverter IV2 are connected between the NAND gate 113 and the gate of pMOS transistor PM1 of the main driver 112. Further, the power supply voltage VDD0 is connected to the other end of pMOS transistors PM8 and PM9 connected in series.

The output enable signal OE and data DA are input to the NAND gate 113. For example, when both signal OE and data DA are high, signal PONb is low. Thus, pMOS transistor PM1 of the main driver 112 is turned on, and makes data DQ output from the terminal 103 high. The NOR gate 114 outputs signal NON to the main driver 112. Inverter IV3, one end of nMOS transistors NM8 and NM9 connected in series, and inverter IV4 are connected between the NOR gate 114 and the gate of nMOS transistor NM1 of the main driver 112. Further, the reference voltage VSS0 is connected to the other end of nMOS transistors NM8 and NM9 connected in series.

The output enable signal OE and data DA are input to the NOR gate 114. For example, when signal OE is high and data DA is low, signal NON is high. Thus, nMOS transistor NM1 of the main driver 112 is turned on, and makes data DQ output from the terminal 103 low.

Now, signals PONb and NON adjusted by the duty ratio adjustment circuit 115 in the output driver 110 are described.

Figure 6A:
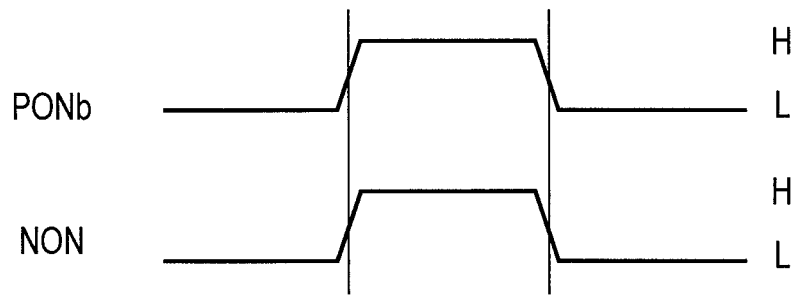
FIGS. 6A and 6B are waveform charts of drive signals PONb and NON dependent on the presence of a terminator according to the first embodiment.
Figure 6B:
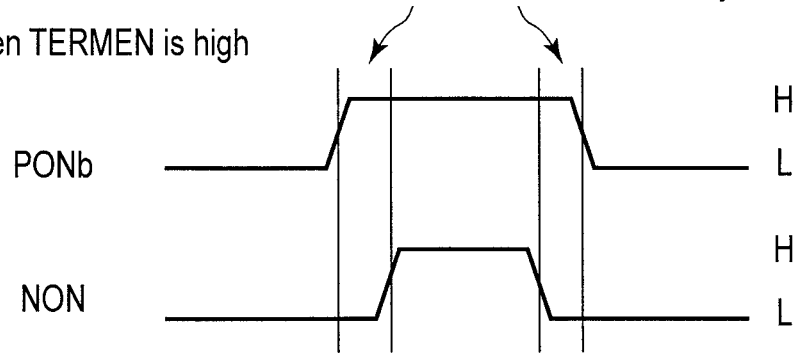

FIGS. 6A and 6B are charts showing the waveforms of the drive signals PONb and NON dependent on the presence of the terminator.

The control signal TERMEN is input to the duty ratio adjustment circuit 115 as a signal for recognizing whether the terminator 202 is provided at the far end of the output of the output driver 110. For example, signal TERMEN when high indicates that the terminator 202 is provided, and signal TERMEN when low indicates that the terminator 202 is not provided. The control signal TERMEN can be set by a register, and can also be input from the outside. Alternatively, the semiconductor integrated circuit 100 may generate the control signal TERMEN after the judgment on whether the semiconductor memory to be connected has a terminator.

When the terminator 202 is not provided, that is, when the control signal TERMEN is low, the duty ratio adjustment circuit 115 does not function. That is, both pMOS transistor PM9 and nMOS transistor NM9 are turned off, the drive signals PONb and NON have substantially the same waveform as shown in FIG. 6A, and the duty ratio (the ratio of the high period) is nearly 50%. As a result, pMOS transistor PM1 of the main driver 112 and nMOS transistor NM1 of the main driver 112 are not turned off simultaneously, and pMOS transistor PM1 and nMOS transistor NM1 are weakly turned on simultaneously. The duty ratio indicates the ratio of the high period to one cycle of the high and low periods. For example, when the impedance of the transmission line is 60 ohms, the output impedance is 60 ohms if each of the impedances that half turn on pMOS transistor PM1 and nMOS transistor NM1 is 120 ohms. Thus, reflected waves can be completely absorbed.

In this way, the reflected waves of data DQ reflected from the far end are absorbed by the pMOS driver and the nMOS driver of the main driver 112. At the same time, pMOS transistor PM1 and nMOS transistor NM1 are weakly turned on simultaneously, and a slight shoot-through current is thereby generated. However, further reflection of the reflected waves in the output driver 110 can be inhibited.

On the other hand, when the terminator 202 is provided, that is, when the control signal TERMEN is high, both pMOS transistor PM9 and nMOS transistor NM9 are turned on. Thus, as shown in FIG. 6B, the high period of signal PONb is longer than when the control signal TERMEN is low, and the duty ratio is more than 50%. The high period of signal NON is shorter than when the control signal TERMEN is low, and the duty ratio is less than 50%. This produces a period in which pMOS transistor PM1 of the main driver 112 and nMOS transistor NM1 of the main driver 112 are simultaneously turned off.

It is thus possible to prevent the shoot-through current generated in the pMOS driver and the nMOS driver of the main driver 112. When the terminator 202 is provided, data DQ output from the output driver 110 is absorbed by the terminator 202, so that the reflected waves do not return. Therefore, there may be a period in which pMOS transistor PM1 and nMOS transistor NM1 are simultaneously turned off. In order to eliminate the shoot-through current, the period in which pMOS transistor PM1 and nMOS transistor NM1 are simultaneously turned off should rather be actively provided.

In the present embodiment, the control signal TERMEN and the duty ratio adjustment circuit 115 are provided. The control signal TERMEN indicates the presence of the terminator that absorbs the signal output from the output driver 110. The duty ratio adjustment circuit 115 adjusts the duty ratios of signals PONb and NON in accordance with the control signal TERMEN. The control signal TERMEN is then used to change the high period of signal PONb for driving pMOS transistor PM1 and the duration of the high period of signal NON for driving nMOS transistor NM1. In this way, the absorption of the reflected waves and the generation of the shoot-through current are adjusted in accordance with the presence of the terminator that absorbs the output signal from the output driver, so that the transmission characteristics of the output signal can be improved simultaneously with the inhibition of the shoot-through current.

Now, an output driver according to a modification of the first embodiment is described.

Figure 7:
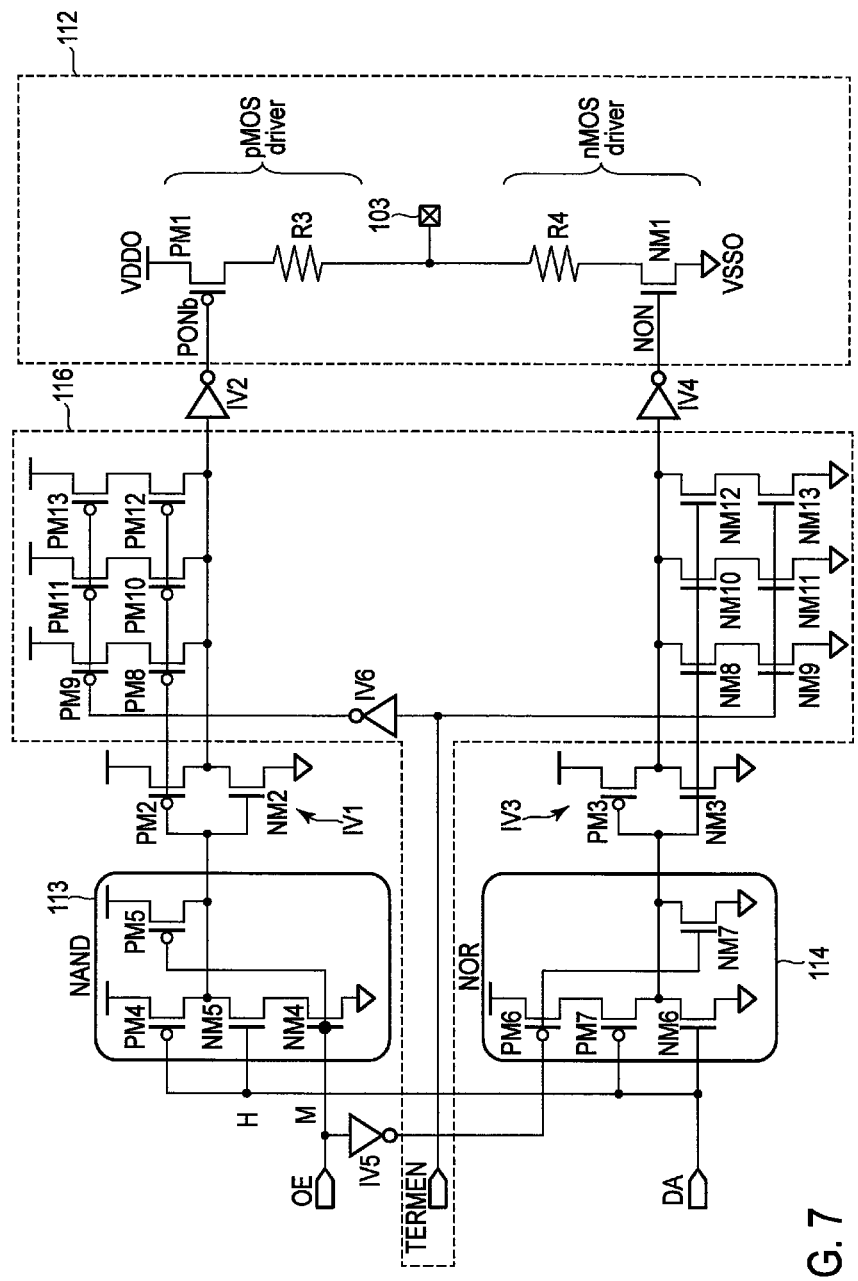
FIG. 7 is a circuit diagram showing another configuration example of the output driver according to the first embodiment.

FIG. 7 is a circuit diagram showing another configuration example of the output driver according to the first embodiment.

The output driver shown in FIG. 7 has a configuration in which a duty ratio adjustment circuit 116 is disposed instead of the duty ratio adjustment circuit 115 according to the first embodiment shown in FIG. 5. More specifically, for the circuit shown in FIG. 5, pMOS transistors PM10 to PM13 are added to an output stage of the NAND gate 113, and nMOS transistors NM10 to NM13 are added to an output stage of the NOR gate 114.

The transistor size (channel width) of pMOS transistors PM10 and PM11 is double the transistor size of pMOS transistor PM8. The transistor size of pMOS transistors PM12 and PM13 is triple the transistor size of pMOS transistor PM8. The transistor size of nMOS transistors NM10 and NM11 is double the transistor size of nMOS transistor NM8. The transistor size of nMOS transistors NM12 and NM13 is triple the transistor size of nMOS transistor NM8.

According to this modification, when the control signal TERMEN is high, three kinds of pMOS transistors different in transistor size can be used to adjust the duration of the high period of signal PONb to more than one kind. Similarly, three kinds of nMOS transistors different in transistor size can be used to adjust the duration of the high period of signal NON to more than one kind. Thus, according to this modification, the duty ratios of the drive signals PONb and NON can be adjusted to more than one kind.

Second Embodiment

An output driver according to the second embodiment is described. Here, the configuration of the output driver and the waveforms of drive signals PONb and NON are described. The configuration according to the second embodiment is similar in other respects to that according to the first embodiment.

Figure 8:
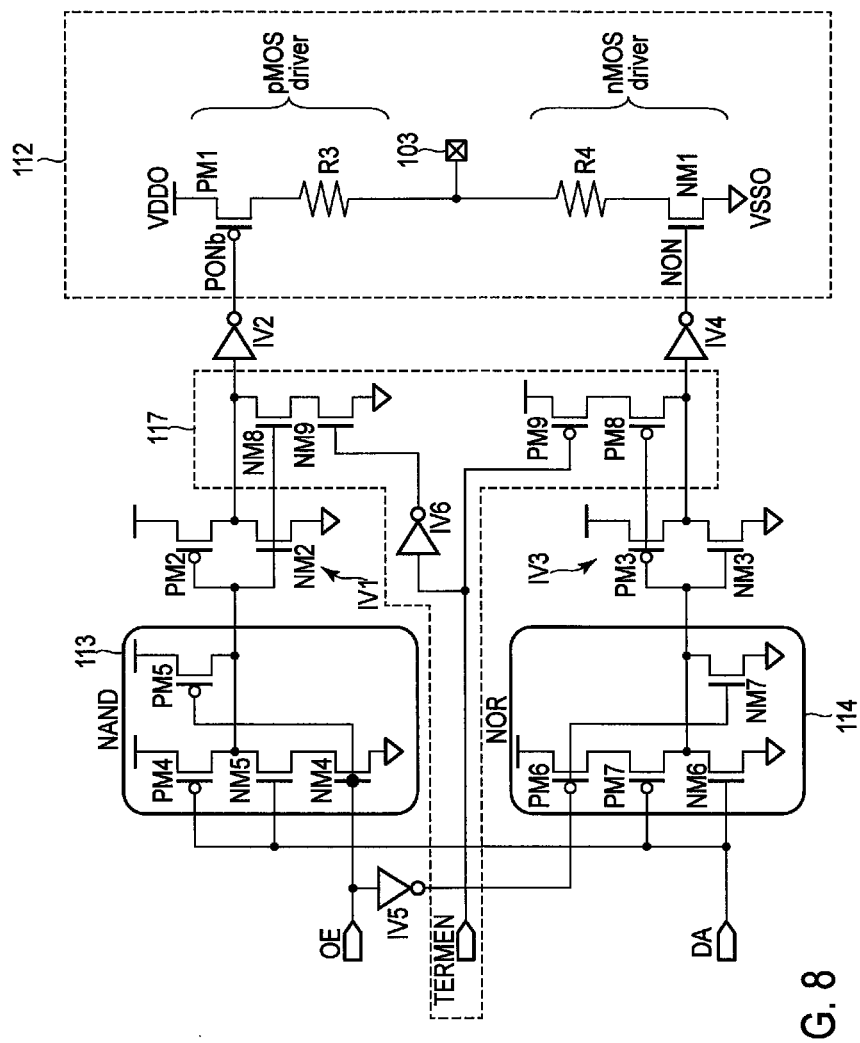
FIG. 8 is a circuit diagram showing the configuration of an output driver according to a second embodiment.

FIG. 8 is a circuit diagram showing the configuration of an output driver according to the second embodiment.

As shown, in the configuration according to the second embodiment, a duty ratio adjustment circuit 117 is disposed instead of the duty ratio adjustment circuit 115 according to the first embodiment shown in FIG. 5. More specifically, inverter IV1 comprising pMOS transistor PM2 and nMOS transistor NM2, one end of nMOS transistors NM8 and NM9 connected in series, and inverter IV2 are connected between a NAND gate 113 and the gate of pMOS transistor PM1. Further, a reference voltage VSS0 is connected to the other end of nMOS transistors NM8 and NM9 connected in series.

Inverter IV3 comprising pMOS transistor PM3 and nMOS transistor NM3, one end of pMOS transistors PM8 and PM9 connected in series, and inverter IV4 are connected between a NOR gate 114 and the gate of nMOS transistor NM1. Further, a power supply voltage VDD0 is connected to the other end of pMOS transistors PM8 and PM9 connected in series. The configuration according to the second embodiment is similar in other respects to that according to the first embodiment shown in FIG. 5.

Figure 9A:
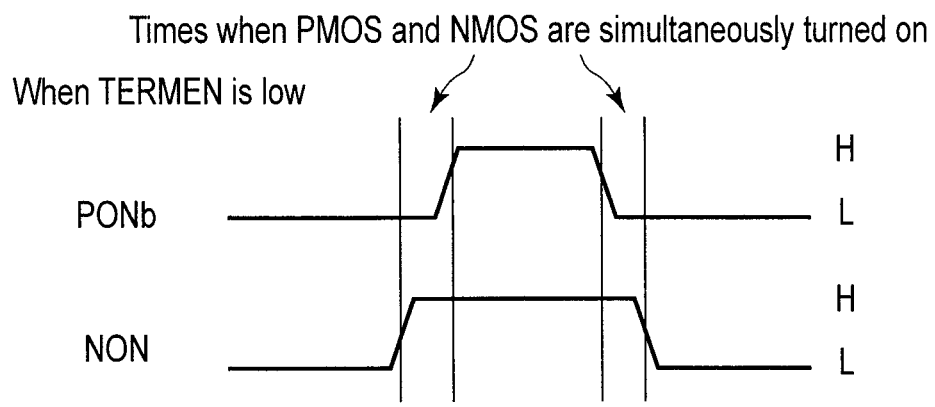
FIGS. 9A and 9B are waveform charts of drive signals PONb and NON dependent on the presence of a terminator according to the second embodiment.
Figure 9B:
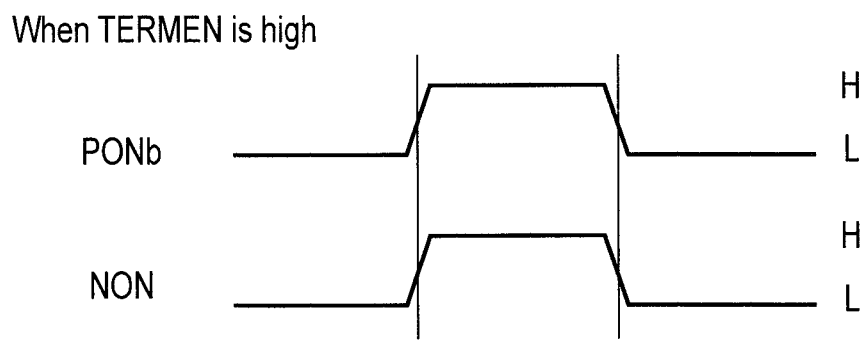

FIGS. 9A and 9B are charts showing the waveforms of signals PONb and NON dependent on the presence of a terminator.

When a terminator 202 is not provided, that is, when a control signal TERMEN is low, both nMOS transistor NM9 and nMOS transistor NM8 are turned on. Thus, as shown in FIG. 9A, the high period of signal PONb is shorter than when signal TERMEN is high, and the duty ratio is less than 50%. The high period of signal NON is longer than when signal TERMEN is high, and the duty ratio is more than 50%. This produces a period in which pMOS transistor PM1 of a pMOS driver and nMOS transistor NM1 of an nMOS driver are simultaneously turned on.

In this way, reflected waves of data DQ reflected from the far end are absorbed by the pMOS driver and the nMOS driver of a main driver 112. At the same time, pMOS transistor PM1 and nMOS transistor NM1 are simultaneously turned on, and a shoot-through current is thereby generated. However, the inhibition of further reflection of the reflected waves in an output driver 110 is given priority.

On the other hand, when the terminator 202 is provided, that is, when signal TERMEN is high, both pMOS transistor PM9 and nMOS transistor NM9 are turned off, the drive signals PONb and NON have substantially the same waveform as shown in FIG. 9B, and the duty ratio is nearly 50%. As a result, pMOS transistor PM1 of the pMOS driver and nMOS transistor NM1 of the nMOS driver are not turned on simultaneously.

It is thus possible to minimize the generation of a shoot-through current in the pMOS driver and the nMOS driver of the main driver 112. When the terminator 202 is provided, data DQ output from the output driver 110 is absorbed by the terminator 202, so that the reflected waves do not return. Therefore, the shoot-through current is inhibited so that pMOS transistor PM1 and nMOS transistor NM1 are not simultaneously turned on.

According to the present embodiment, the duty ratios of signals PONb and NON can be adjusted to more than one kind by combining the transistors of various sizes of the duty ratio adjustment circuit as in FIG. 7 according to the first embodiment.

In the present embodiment, the control signal TERMEN and the duty ratio adjustment circuit 117 are provided. The control signal TERMEN indicates the presence of the terminator that absorbs the signal output from the output driver 110. The duty ratio adjustment circuit 117 adjusts the duty ratios of signals PONb and NON in accordance with the control signal TERMEN. The control signal TERMEN is then used to change the high period of signal PONb for driving pMOS transistor PM1 and the duration of the high period of signal NON for driving nMOS transistor NM1. In this way, the absorption of the reflected waves and the generation of the shoot-through current are adjusted in accordance with the presence of the terminator that absorbs the output signal from the output driver, so that the transmission characteristics of the output signal can be improved simultaneously with the inhibition of the shoot-through current.

Third Embodiment

An output driver according to the third embodiment is described. Here, the configuration of the output driver and the waveforms of drive signals PONb and NON are described. The configuration according to the third embodiment is similar in other respects to that according to the first embodiment.

Figure 10:
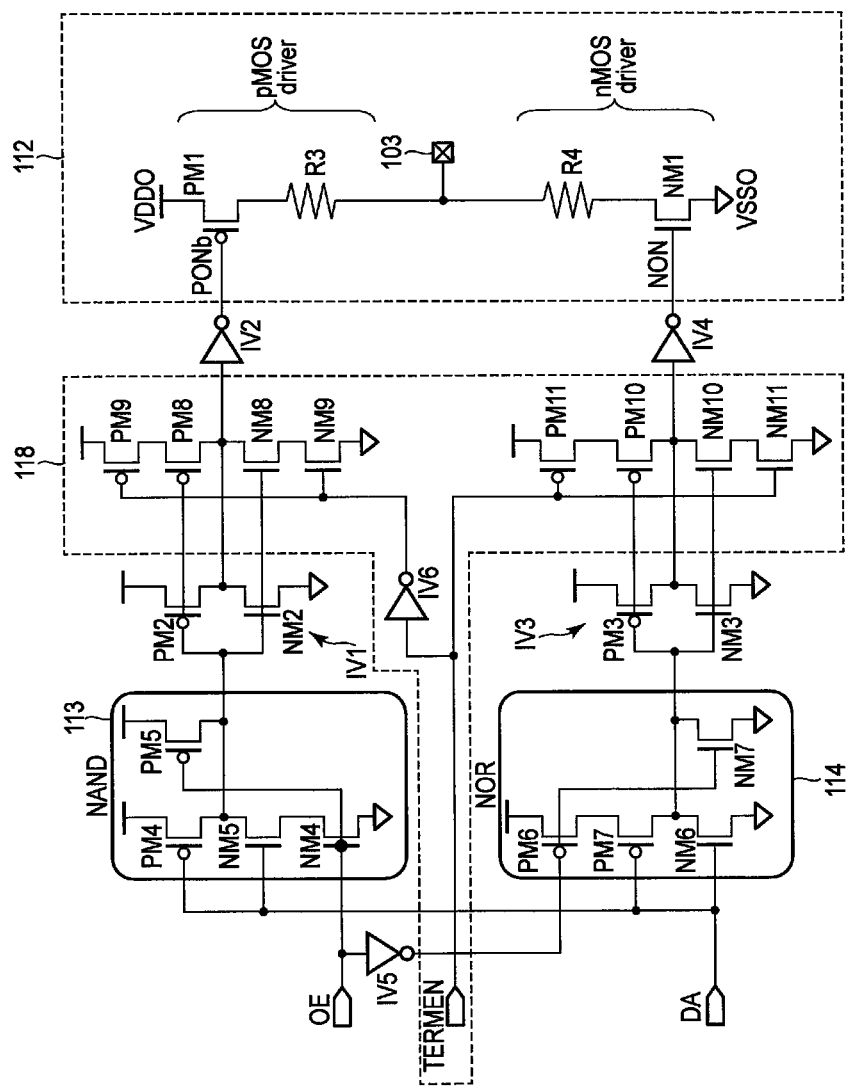
FIG. 10 is a circuit diagram showing the configuration of an output driver according to a third embodiment.

FIG. 10 is a circuit diagram showing the configuration of an output driver according to the third embodiment.

As shown, in the configuration according to the third embodiment, a duty ratio adjustment circuit 118 is disposed instead of the duty ratio adjustment circuit 115 according to the first embodiment shown in FIG. 5. More specifically, inverter IV1 comprising pMOS transistor PM2 and nMOS transistor NM2, one end of nMOS transistors NM8 and NM9 connected in series, one end of nMOS transistors NM8 and NM9 connected in series, and inverter IV2 are connected between a NAND gate 113 and the gate of pMOS transistor PM1. Further, a power supply voltage VDD0 is connected to the other end of pMOS transistors PM8 and PM9 connected in series, and a reference voltage VSS0 is connected to the other end of nMOS transistors NM8 and NM9.

Inverter IV3 comprising pMOS transistor PM3 and nMOS transistor NM3, one end of nMOS transistors NM10 and NM11 connected in series, one end of pMOS transistors PM10 and PM11 connected in series, and inverter IV4 are connected between a NOR gate 114 and the gate of nMOS transistor NM1. Further, the reference voltage VSS0 is connected to the other end of nMOS transistors NM10 and NM11 connected in series, and the power supply voltage VDD0 is connected to the other end of pMOS transistors PM10 and PM11. The configuration according to the third embodiment is similar in other respects to that according to the first embodiment shown in FIG. 5.

Figure 11A:
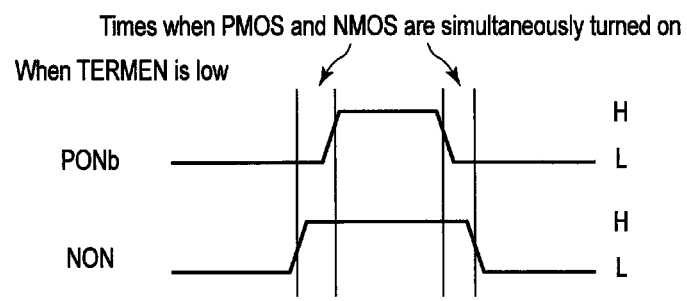
FIGS. 11A and 11B are waveform charts of drive signals PONb and NON dependent on the presence of a terminator according to the third embodiment.
Figure 11B:
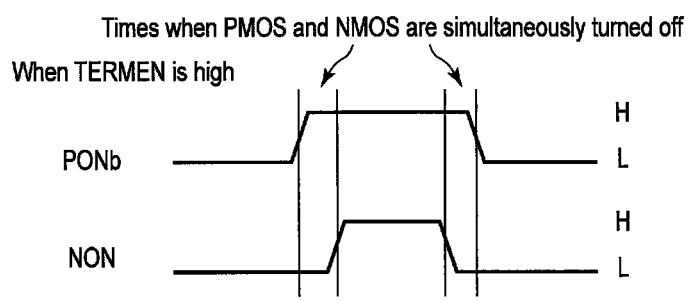

FIGS. 11A and 11B are charts showing the waveforms of signals PONb and NON dependent on the presence of a terminator.

When a terminator 202 is not provided, that is, when a control signal TERMEN is low, both pMOS transistor PM9 and nMOS transistor NM11 are turned off, and both nMOS transistor NM9 and pMOS transistor PM11 are turned on. Thus, as shown in FIG. 11A, the high period of signal PONb is shorter than when signal TERMEN is high, and the duty ratio is less than 50%. The high period of signal NON is longer than when signal TERMEN is high, and the duty ratio is more than 50%. This produces a period in which pMOS transistor PM1 of a main driver 112 and nMOS transistor NM1 of the main driver 112 are simultaneously turned on.

Thus, the period in which pMOS transistor PM1 and nMOS transistor NM1 are simultaneously turned on is provided so that the reflected waves of data DQ reflected from the far end are absorbed by the pMOS driver and the nMOS driver of the main driver 112. At the same time, pMOS transistor PM1 and nMOS transistor NM1 are simultaneously turned on, and a shoot-through current is thereby generated. However, the inhibition of further reflection of the reflected waves in an output driver 110 is given priority.

On the other hand, when the terminator 202 is provided, that is, when signal TERMEN is high, both pMOS transistor PM9 and nMOS transistor NM11 are turned on, nMOS transistor NM9 and pMOS transistor PM11 are turned off. Thus, as shown in FIG. 11B, the high period of signal PONb is longer than when signal TERMEN is low, and the duty ratio is more than 50%. The high period of signal NON is shorter than when signal TERMEN is low, and the duty ratio is less than 50%. This produces a period in which pMOS transistor PM1 of the main driver 112 and nMOS transistor NM1 of the main driver 112 are simultaneously turned off.

It is thus possible to prevent the shoot-through current generated in the pMOS driver and the nMOS driver of the main driver 112. When the terminator 202 is provided, data DQ output from the output driver 110 is absorbed by the terminator 202, so that the reflected waves do not return. Therefore, there may be a period in which pMOS transistor PM1 and nMOS transistor NM1 are simultaneously turned off. In order to eliminate the shoot-through current, the period in which pMOS transistor PM1 and nMOS transistor NM1 are simultaneously turned off should rather be actively provided.

In the present embodiment, the control signal TERMEN and the duty ratio adjustment circuit 118 are provided. The control signal TERMEN indicates the presence of the terminator that absorbs the signal output from the output driver 110. The duty ratio adjustment circuit 118 adjusts the duty ratios of signals PONb and NON in accordance with the control signal TERMEN. The control signal TERMEN is then used to change the high period of signal PONb for driving pMOS transistor PM1 and the duration of the high period of signal NON for driving nMOS transistor NM1. In this way, the absorption of the reflected waves and the generation of the shoot-through current are adjusted in accordance with the presence of the terminator that absorbs the output signal from the output driver, so that the transmission characteristics of the output signal can be improved simultaneously with the inhibition of the shoot-through current.

As described above, according to the first, second, and third embodiments, it is possible to provide an output driver which can reduce the shoot-through current and which can improve the transmission characteristics of the output signal.

In the examples shown here, the semiconductor integrated circuit and the semiconductor memory comprise separate chips, and the output driver incorporated in the semiconductor integrated circuit drives the semiconductor memory. However, the present embodiments are also applicable when the semiconductor integrated circuit including the output driver and the semiconductor memory are formed on the same chip.

As described above, according to the embodiments, it is possible to provide an output driver which varies the output impedance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An output driver which outputs an output signal to a transmission line, the output driver comprising:
   a pre-driver which changes a duty ratio of a first drive signal and a duty ratio of a second drive signal to a plurality of patterns in accordance with a control signal; and
   a main driver which connects in series a first driver driven by the first drive signal and a second driver driven by the second drive signal and which outputs the output signal to the transmission line from a connection node of the first and second drivers;
   wherein when a terminator which absorbs the output signal is provided in the transmission line, the pre-driver generates the first and second drive signals that turn off both the first and second drivers in a predetermined period; and
   wherein when the terminator which absorbs the output signal is not provided in the transmission line, the pre-driver generates the first and second drive signals that weakly turn on both the first and second drivers in a predetermined period.

2. The output driver according to claim 1, wherein the control signal is changed by whether the terminator which absorbs the output signal is provided in the transmission line.

3. The output driver according to claim 1, wherein the first driver includes a p-channel MOS transistor, and the second driver includes an n-channel MOS transistor.

4. The output driver according to claim 3, wherein the first and second drivers are connected between a power supply voltage and a reference voltage, and both the first and second drivers are turned off in a predetermined period to prevent a shoot-through current from running between the power supply voltage and the reference voltage via the first and second drivers.

5. The output driver according to claim 1, wherein the first driver includes a p-channel MOS transistor and a first resistance, and the second driver includes an n-channel MOS transistor and a second resistance.

6. The output driver according to claim 1, wherein the pre-driver comprises an n-channel MOS transistor connected to the first drive signal, and a p-channel MOS transistor connected to the second drive signal.

7. An output driver which outputs an output signal to a transmission line, the output driver comprising:
   a pre-driver which changes a duty ratio of a first drive signal and a duty ratio of a second drive signal to a plurality of patterns in accordance with a control signal; and
   a main driver which connects in series a first driver driven by the first drive signal and a second driver driven by the second drive signal and which outputs the output signal to the transmission line from a connection node of the first and second drivers;
   wherein when the output signal is not reflected and does not return to the main driver, the pre-driver generates the first and second drive signals that turn off both the first and second drivers; and
   wherein when the output signal is reflected and returns to the main driver, the pre-driver generates the first and second drive signals that weakly turn on both the first and second drivers.

8. The output driver according to claim 7, wherein the first driver includes a p-channel MOS transistor, and the second driver includes an n-channel MOS transistor.

9. The output driver according to claim 8, wherein the first and second drivers are connected between a power supply voltage and a reference voltage, and both the first and second drivers are turned off in a predetermined period to prevent a shoot-through current from running between the power supply voltage and the reference voltage via the first and second drivers.

10. The output driver according to claim 7, wherein the first driver includes a p-channel MOS transistor and a first resistance, and the second driver includes an n-channel MOS transistor and a second resistance.

11. The output driver according to claim 7, wherein the pre-driver comprises:
- a NAND gate which receives an input signal and outputs the first drive signal;
- a NOR gate which receives the input signal and outputs the second drive signal; and
- an adjustment circuit which adjusts a duty ratios of the first and second drive signals, wherein the adjustment circuit comprises a p-channel MOS transistor connected to an output stage of the NAND gate, and an n-channel MOS transistor connected to an output stage of the NOR gate.

12. The output driver according to claim 7, wherein the pre-driver comprises a plurality of p-channel MOS transistors connected in parallel to the first drive signal, and a plurality of n-channel MOS transistors connected in parallel to the second drive signal.

13. A memory system comprising:
- a memory;
- a memory controller configured to control a operation of the memory;
- a transmission line configured to connect to the memory and the memory controller; and
- an output driver configured to output an output signal to the transmission line, the output driver comprising:
  - a pre-driver which changes a duty ratio of a first drive signal and a duty ratio of a second drive signal to a plurality of patterns in accordance with a control signal; and
  - a main driver which connects in series a first driver driven by the first drive signal and a second driver driven by the second drive signal and which outputs the output signal to the transmission line from a connection node of the first and second drivers;
- wherein when a terminator which absorbs the output signal is provided in the transmission line via the memory, the pre-driver generates the first and second drive signals that turn off both the first and second drivers in a predetermined period; and
- wherein when the terminator which absorbs the output signal is not provided in the transmission line, the pre-driver generates the first and second drive signals that weakly turn on both the first and second drivers in a predetermined period.

14. The memory system according to claim 13, wherein the control signal is changed by whether the terminator which absorbs the output signal is provided in the transmission line via the memory.

15. The memory system according to claim 13, wherein the first driver includes a p-channel MOS transistor and a first resistance, and the second driver includes an n-channel MOS transistor and a second resistance.

16. The memory system according to claim 15, wherein the first and second drivers are connected between a power supply voltage and a reference voltage, and both the first and second drivers are turned off in a predetermined period to prevent a shoot-through current from running between the power supply voltage and the reference voltage via the first and second drivers.

* * * * *